(12) United States Patent
Cheng et al.

(10) Patent No.: US 9,601,345 B2
(45) Date of Patent: Mar. 21, 2017

(54) FIN TRIMMING IN A DOUBLE SIT PROCESS

(71) Applicant: International Business Machines Corporation, Armonk, NY (US)

(72) Inventors: Kangguo Cheng, Schenectady, NY (US); Matthew E. Colburn, Schenectady, NY (US); Bruce B. Doris, Slingerlands, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/670,494

(22) Filed: Mar. 27, 2015

(65) Prior Publication Data

US 2016/0284558 A1    Sep. 29, 2016

(51) Int. Cl.
| | |
|---|---|
| *H01L 29/06* | (2006.01) |
| *H01L 21/308* | (2006.01) |
| *H01L 21/3065* | (2006.01) |
| *H01L 27/088* | (2006.01) |

(52) U.S. Cl.
CPC ...... *H01L 21/3086* (2013.01); *H01L 21/3065* (2013.01); *H01L 27/0886* (2013.01)

(58) Field of Classification Search
CPC ............. H01L 21/3086; H01L 21/3065; H01L 27/0886
USPC .......................................................... 257/623
See application file for complete search history.

(56) References Cited

U.S. PATENT DOCUMENTS

| | | | |
|---|---|---|---|
| 6,875,703 B1 | 4/2005 | Furukawa et al. | |
| 7,087,532 B2 | 8/2006 | Dobuzinsky et al. | |
| 7,381,655 B2 | 6/2008 | Furukawa et al. | |
| 7,651,951 B2 | 1/2010 | Tran et al. | |
| 7,763,531 B2 | 7/2010 | Abadeer et al. | |
| 7,989,355 B2 | 8/2011 | Shieh et al. | |
| 8,445,384 B2 | 5/2013 | Dixit | |
| 8,557,675 B2 | 10/2013 | LiCausi | |
| 8,617,996 B1 * | 12/2013 | Chi ................... | H01L 21/30604 257/E21.377 |
| 2012/0280365 A1 * | 11/2012 | Cheng .................. | H01L 21/033 257/618 |
| 2013/0309838 A1 * | 11/2013 | Wei .................... | H01L 21/76229 438/424 |
| 2013/0330889 A1 * | 12/2013 | Yin .................. | H01L 21/823821 438/197 |
| 2014/0353760 A1 * | 12/2014 | Loubet ............ | H01L 21/823821 257/369 |
| 2015/0123212 A1 * | 5/2015 | Hu ...................... | H01L 21/3086 257/401 |

* cited by examiner

*Primary Examiner* — Matthew Gordon
(74) *Attorney, Agent, or Firm* — Isaac J. Gooshaw (57) ABSTRACT

A semiconductor structure and the method of forming that semiconductor structure. The method includes formation of a plurality of fins from a layer of semiconductor material. At least one fin of the plurality of fins is at least fifty percent wider than each of a group of fins included in the plurality of fins. The method also includes selectively removing the one fin such that only the group of fins remain.

18 Claims, 5 Drawing Sheets

FIN TRIMMING IN A DOUBLE SIT PROCESS

BACKGROUND OF THE INVENTION

The present invention relates generally to the field of semiconductor devices, and more particularly to FINFET semiconductor structures.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques, and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

A metal oxide semiconductor field-effect transistor (MOSFET) has been the building block for most computing devices for the last several decades. A MOSFET is a four terminal device made up of a drain, a source, a gate and a bulk substrate. In digital circuits, the MOSFET is essentially used as a switch. The source and drain are two ends of the switch, with the channel being turned on and off under the control of the gate. The gate controls the conductivity through the channel through an electric field and is insulated from the channel by a thin layer of dielectric material, such as silicon dioxide. With no voltage potential across the gate and bulk, a depletion region forms around the drain and source blocking any current flow.

The MOSFET has been the primary building block of integrated circuits for more than forty years. The advances in electronics have been driven primarily by the ability to scale down the size of the MOSFETs used in integrated circuits. This scaling achieves improvements on many fronts. Smaller transistors allow more transistors to be put on the same size chip, which has allowed integrations levels to rise from the hundreds of transistors to hundreds of millions of transistors.

With the continuous reduction of surface area in a semiconductor wafer available for a single semiconductor device, engineers are faced with the challenge of ever increasing device density. For sub-80 nm pitch patterning, one technique is to achieve twice the pattern density through a technique called sidewall imaging transfer (SIT), which is also known as sidewall spacer image transfer. In a conventional SIT process, a blanket deposition of spacer making material, such as dielectric material, is usually performed after the mandrel lithography development and spacers are then made out of the blanket layer of spacer making material through a directional etching process.

SUMMARY

According to one embodiment of the present disclosure, a structure is provided. The structure comprises: a plurality of fins formed from a layer of semiconductor material, wherein a first fin of the plurality of fins is fifty percent wider than both a second fin and a third fin included in the plurality of fins, wherein the first fin is between the second fin and third fin.

According to one embodiment of the present disclosure, a method of forming a semiconductor structure is provided. The method includes forming a plurality of fins from a layer of semiconductor material, wherein at least one first fin of the plurality of fins is at least fifty percent wider than each second fin of a group of second fins included in the plurality of fins; and selectively removing the at least one first fin such that only the group of second fins remain in the plurality of fins.

According to one embodiment of the present disclosure, a method of forming a semiconductor structure is provided. The method includes selectively removing at least one first fin from a plurality of fins such that only a group of second fins remain in the plurality of fins, wherein selectively removing the at least one fin comprises: applying a first block mask material over a layer of hard-mask material that covers the at least one first fin and the group of second fins; forming an opening through the layer of hard-mask material to expose a portion of at least one first fin while the group of second fins remain covered by the hard-mask material; and etching to remove the at least one first fin.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The method described below in conjunction with FIGS. 1A-5 may be incorporated into typical semiconductor fabrication processes, such as fin field effect transistor (FinFET) fabrication processes described below in conjunction with FIGS. 1A-5. Embodiments may include methods of forming substantially uniform thickness fins for FinFET type devices. Embodiments may provide methods of forming structures that are similar in form, at least in part, to the fins of FinFET type devices using the methods disclosed herein. As described below in conjunction with FIGS. 1A-5, in one embodiment, a set of fins are formed such that the fins have a substantially uniform thickness and a footprint of 30 nanometers (nm) or less. In one embodiment, a set of fins are formed such that the fins have a substantially uniform thickness and a footprint between 20 to 30 nanometers (nm). In another embodiment, a set of fins are formed such that the fins have a substantially uniform thickness and a footprint greater than 30 nanometers (nm).

Embodiments of the present invention recognize that the end fins in many traditional double side image transfer processes have a thickness that is substantially greater than that of nested fins, which are fins between two end fins. Embodiments of the present invention recognize that the performance of a FinFET type device is dependent, at least in part, on the thickness of its fin.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure, may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, semiconductor structures refer to one or more physical structures that comprise semiconductor devices.

The present invention will now be described in detail with reference to the Figures.

Figure 1A:
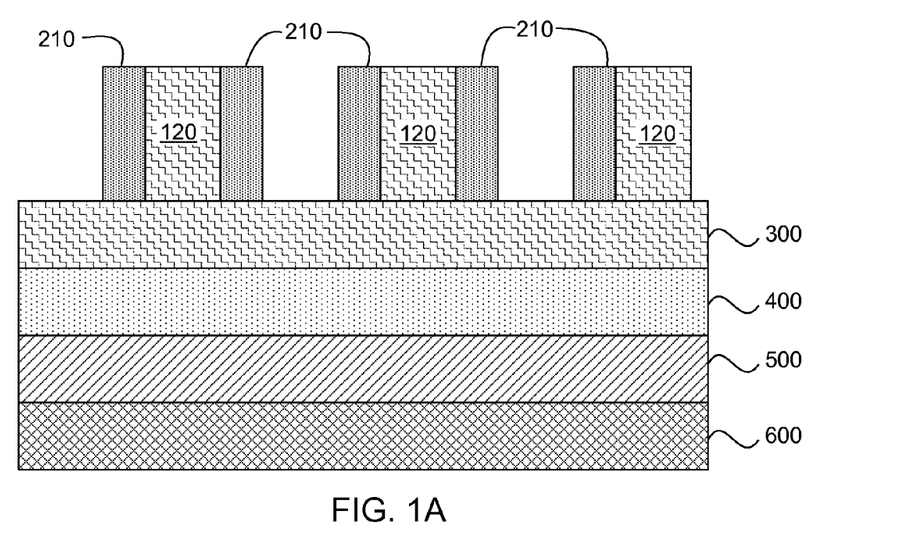
FIG. 1A illustrates a cross-sectional view depicting a first set of mandrels and a sidewall spacers on a stack of layers from which the semiconductor devices of FIG. 5 are fabricated, in accordance with an exemplary embodiment of the present invention.
Figure 5:
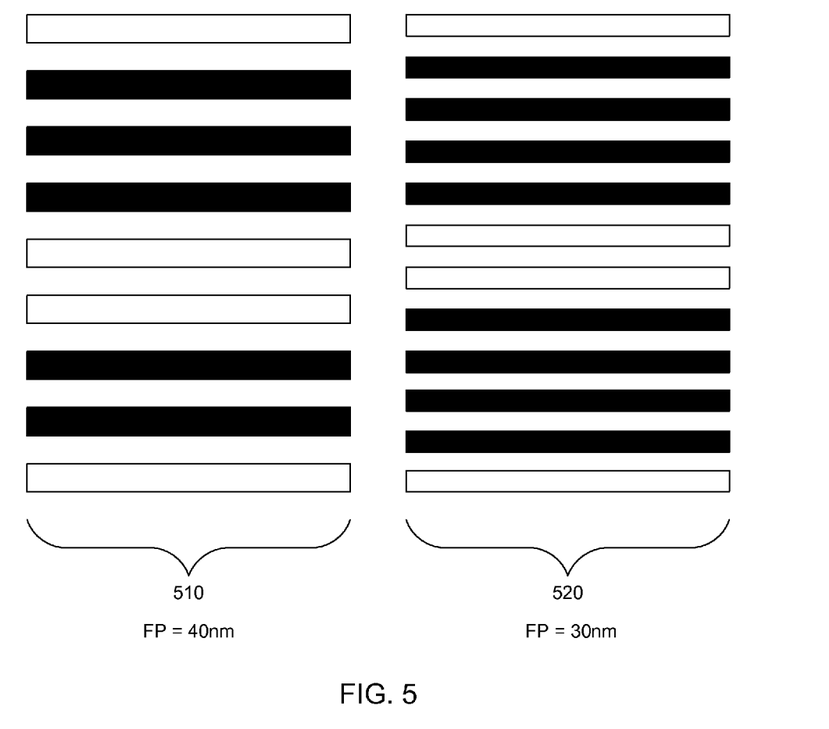
FIG. 5 illustrates a cross-sectional view depicting two variations of semiconductor devices formed using the processes shown FIGS. 1A-4B, in accordance with two embodiments of the present invention.

FIG. 1A illustrates a cross-sectional view depicting a first set of mandrels (mandrels 120) and sidewall spacers 210 on a stack of layers (which includes layers 300, 400, 500, and 600) from which the semiconductor devices of FIG. 5 are fabricated, in accordance with an exemplary embodiment of the present invention. FIG. 1 includes mandrel material 300, semiconductor-on-insulator layer (SOI) 400, buried oxide layer (BOX) 500, and substrate layer 600. In this embodiment, SOI 400, BOX 500, and substrate layer 600 comprise a semiconductor-on-insulator wafer. In general, SOI 400 is a semiconductor layer such as, for example, silicon, silicon germanium, or germanium. In general, BOX 500 is a layer of silicon dioxide or another like dielectric material that will reduce electrical current leakage from active semiconductor devices such as transistors. In this embodiment, substrate layer 600 is a support or "handle" layer at the bottom of the stack. In this embodiment, substrate layer 600 is a dielectric material. In some embodiments, substrate layer 600 may be a semiconductor material or a semiconductor on top of a dielectric material like a semiconductor-on-insulator (SOI) substrate.

In this embodiment, mandrels 120 and mandrel material 300 are composed of amorphous silicon. In this embodiment, sidewall spacers 210 are composed of silicon oxide. In some embodiments, mandrels 120 and sidewall spacers 210 are formed on mandrel material 300 using a combination of deposition processes combined with selective etching processes. In some embodiments, the formation of mandrels 120 and sidewall spacers 210 include other manufacturing processes such as, for example, chemical mechanical polishing processes.

One skilled in the art will recognize that the formation of a structure, as shown in the Figures and described herein, can include a combination of manufacturing processes. Such manufacturing processes typically include combinations of material deposition techniques and material removal techniques. Material deposition technique include, but are not limited to, various material deposition processes such as electrochemical deposition (ED), electroplating, physical vapor deposition (PVD), plasma assisted chemical vapor deposition (PACVD), chemical vapor deposition (CVD), plasma enhanced chemical vapor deposition (PECVD), low pressure chemical vapor deposition (LPCVD), atomic layer deposition (ALD), chemical solution deposition (such as spin coating), and evaporation.

Material removal techniques include, but are not limited to, various material removal processes such as conventional damascene patterning or subtractive etch patterning utilizing lithographic etching. In some embodiments, the etching used in transferring a given pattern to a portion of material comprises a dry etching process, a wet chemical etching process or a combination thereof. The term "dry etching" is used herein to denote an etching technique such as reactive-ion etching (RIE), ion beam etching, plasma etching, or laser ablation. RIE is a type of dry etching which has different characteristics than wet etching. RIE uses chemically reactive plasma to remove material. In RIE, plasma is generated under low pressure (vacuum) by an electromagnetic field. High-energy ions from the plasma collide with the material to be removed and react with it.

In general, the selective removing processes include, but are not limited to, an ion-sputtering process with a gas resource including, but not limited to: Ar, He, Xe, Ne, Kr, Rn, N2 or H2. The ion-sputtering process is the removal of material by atom bombardment, and works by line of sight allowing the horizontal surfaces to be removed and leaving the vertical surfaces with minimal sidewall removal. In some embodiments, after deposition, a conventional planarization process, such as chemical mechanical polishing (CMP), is used to provide a structure that has an upper surface that is substantially planar. The techniques and application of selective etching, including both wet and dry etching, is well understood by those skilled in the art and, as such, a more detailed description of such processes is not presented herein.

Figure 1B:
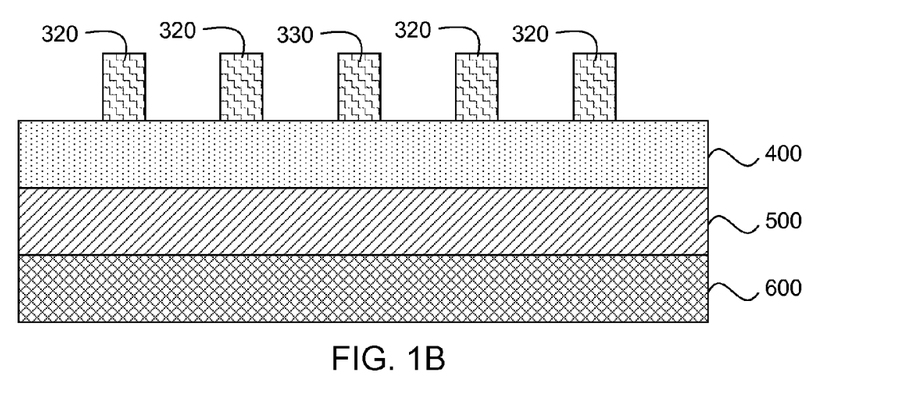
FIG. 1B illustrates a cross-sectional view depicting a second set of mandrels that are formed based on the spacers of FIG. 1A, in accordance with an exemplary embodiment of the present invention.

FIG. 1B illustrates a cross-sectional view depicting a second set of mandrels (mandrels 320 and 330) that are formed based on spacers 210 of FIG. 1A, in accordance with an exemplary embodiment of the present invention. In this embodiment, the fins are formed by applying a sidewall imaging transfer (SIT) technique to the mandrels on the stack of layers (which includes material layers 300, 400, 500, and 600) of FIG. 1A. In this embodiment, to form mandrels 320 and 330, mandrels 120 are removed from the semiconductor structure of FIG. 1A using a selective etching process, leaving behind sidewall spacers 210. A second etching process is then applied to transfer the pattern created by sidewall spacers 210 onto the material of mandrel material 300, thereby creating mandrels 320 and 330. In other words, sidewall spacers 210 protect various portions of the material of mandrel material 300 from the etching process such that those portions still remain after the second etching process. Those remaining portions are mandrels 320 and 330.

Figure 2A:
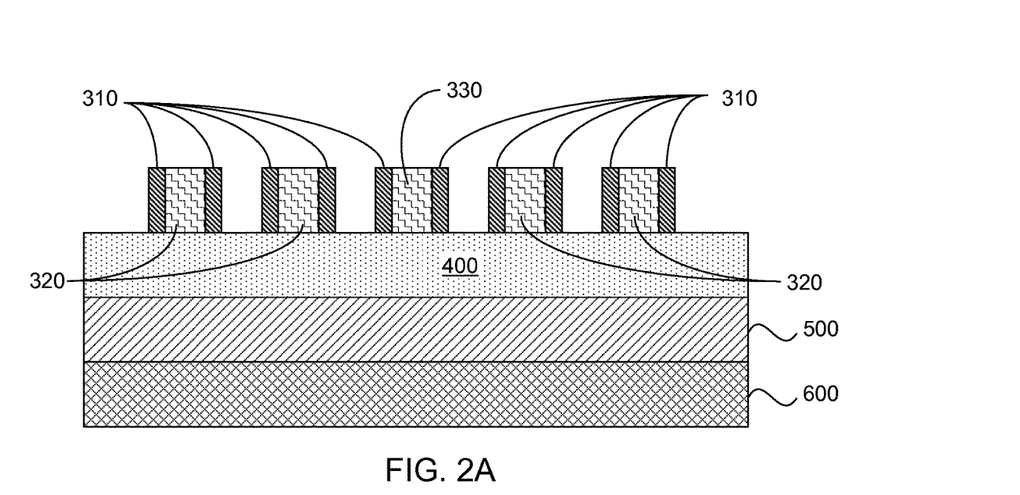
FIG. 2A illustrates a cross-sectional view depicting the formation of sidewall spacers on the second set of mandrels of FIG. 1B, in accordance with an exemplary embodiment of the present invention.

FIG. 2A illustrates a cross-sectional view depicting the formation of sidewall spacers 310 on the second set of mandrels (mandrels 320 and 330) of FIG. 1B, in accordance with an exemplary embodiment of the present invention. In one embodiment, sidewall spacers 310 are formed by depositing a layer of silicon oxide over mandrels 320 and 330 and exposed portions of SOI 400. An etching process then selectively removes horizontal portions of the layer of spacer material, which forms sidewall spacers 310 on the sides of mandrels 320 and 330.

Figure 2B:
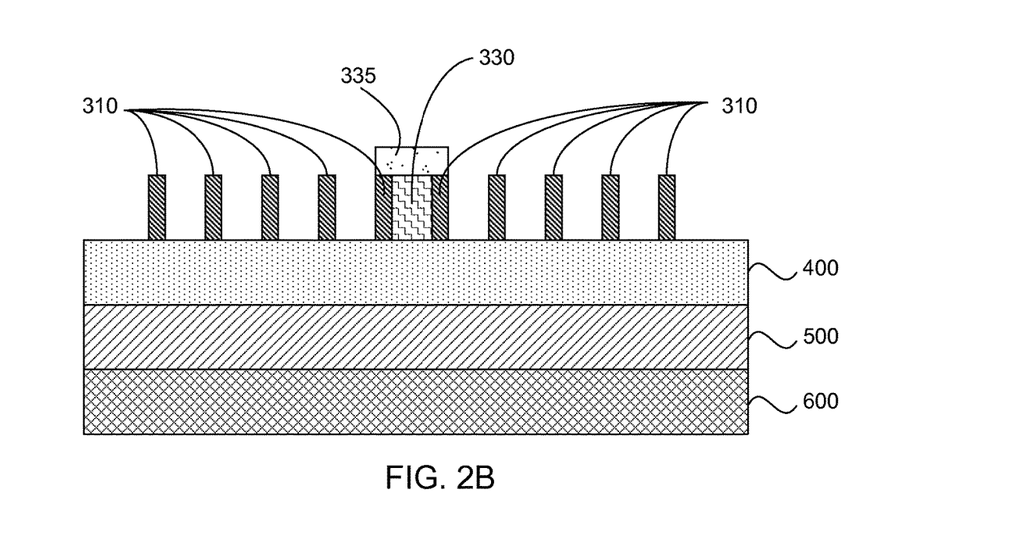
FIG. 2B illustrates a cross-sectional view depicting the removal of select mandrels included in the second set of mandrels of FIG. 2A, in accordance with an exemplary embodiment of the present invention.

FIG. 2B illustrates a cross-sectional view depicting the removal of select mandrels (i.e., mandrels 320) included in the second set of mandrels (i.e., mandrels 320 and 330) of FIG. 2A, in accordance with an exemplary embodiment of the present invention. In general, a portion of block mask 335, (for example, either a photoresist material or an oxide material) is used to protect mandrel 330 from the etching process, while mandrels 320 are not protected. The portion of block mask 335 is removed after mandrels 320 have been removed. As such, the only mandrel remaining in FIG. 2B is mandrel 330. Note that mandrel 330 is still in direct contact with two of sidewall spacers 310, forming a contiguous portion of materials that is significantly wider than any single sidewall spacer 310. This contiguous portion of materials indicates an area over SOI 400 that is to be void of fins (see FIGS. 3A-4B and their associated descriptions for further details).

Figure 3A:
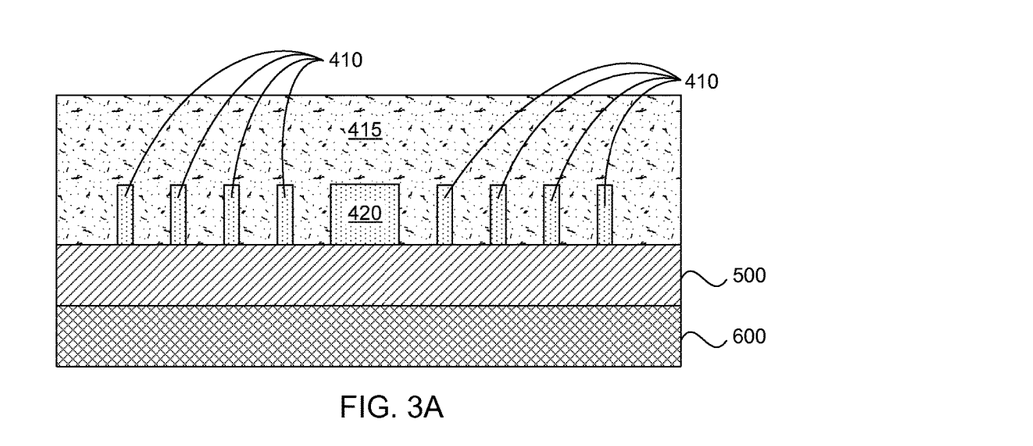
FIG. 3A illustrates a cross-sectional view depicting the formation of fins (vertical channels) based on the sidewall spacers and remaining mandrel of FIG. 2B and the deposition of a layer of hard-mask material, in accordance with an embodiment of the present invention.

FIG. 3A illustrates a cross-sectional view depicting the formation of fins 410 and 420 (which are both vertical channels) based on the sidewall spacers 310 and remaining mandrel 330 of FIG. 2B and the deposition of a layer of hard-mask material 415, in accordance with an embodiment of the present invention. Fins 410 and 420 are formed through the application of an etching process (for example, reactive ion etching), to the semiconductor structure of FIG. 2B. In this etching process, a comparatively larger portion of SOI 400 is protected from etching by mandrel 330 and those sidewall spacers 310 in contact with mandrel 330 relative to the areas protected by sidewall spacers 310 that are not in contact with mandrel 330. In some embodiments, mandrel 330 and sidewall spacers 310 are covered by a block mask (e.g., block mask 335), which further protects the portion of SOI 400.

As such, fin 420 is formed as a result of mandrel 330 and two of sidewall spacers 310 protecting a comparatively large portion of SOI 400 relative to the portions protected by a single sidewall spacer 310. Therefore, as shown in FIG. 3A, fin 420 is significantly wider (i.e., has a larger width) than any of fins 410. In one embodiment, fin 420 is at least fifty percent wider than each of fins 410. Note also that fin 420 constitutes an "end fin" and fins 410 constitute "nested fins". As a result of this manufacturing process, fins 410 all have substantially similar widths. In one implementation, fins 410 have a footprint of 30 nm while fin 420 has a footprint of at least approximately 60 nm. Note that as is understood by those skilled in the art, there is typically a small degree of variation between the footprints of any two fins. However, for the purposes of this disclosure, all of fins 410 are substantially similar in footprint such that any such differences do not substantially change the electrical characteristics of one particular fin 410 when compared to another fin 410. In some cases, the acceptable level of variation in footprint of one particular fin 410 when compared to another fin 410 is within a range or is below a threshold defined by a designer of the semiconductor structure. Note that after fins 410 and fin 420 are formed, a layer of layer of hard-mask material 415 is deposited. As such, hard-mask material 415 fills the gaps between fin 420 and covers the top of fin 420.

Figure 3B:
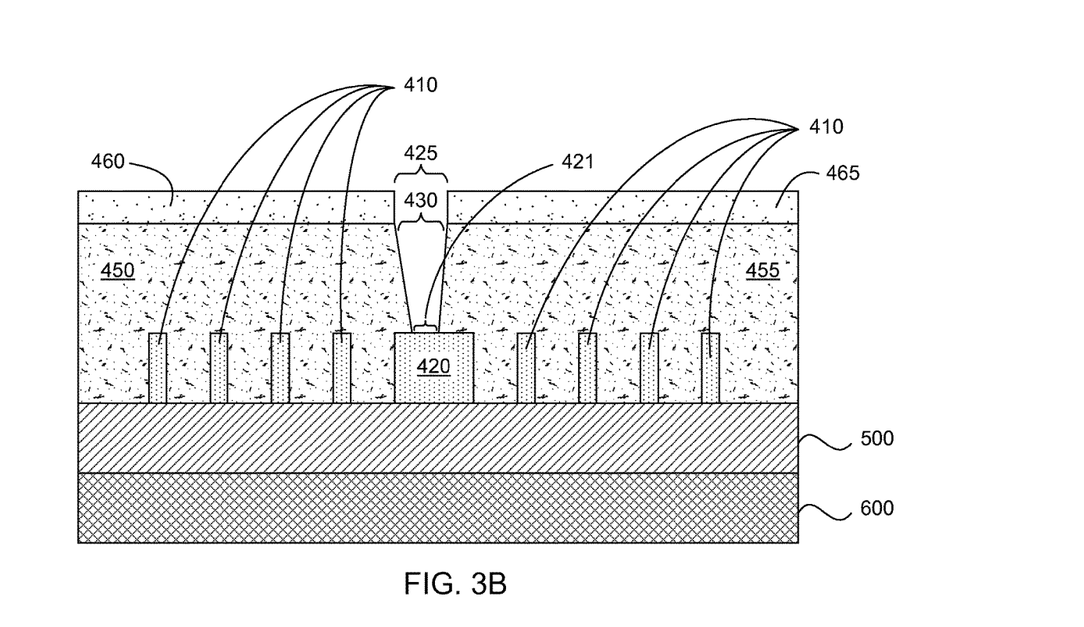
FIG. 3B illustrates a cross-sectional view depicting the etching of the layer of hard-mask material of the semiconductor structures of FIG. 3A and the formation of an opening through that hard-mask material, in accordance with an embodiment of the present invention.

FIG. 3B illustrates a cross-sectional view depicting the etching of the layer of hard-mask material of the semiconductor structures of FIG. 3A and the formation of an opening (430) through that hard-mask material), in accordance with an embodiment of the present invention. The formation of opening 430 yields two portions of hard-mask material 450 and 455. Note that opening 430 is landed on the top surface (indicated by bracket 421) of fin 420, i.e., opening 430 exposes the top surface of fin 420. Further note that because of the width of fin 420, the tolerance for landing opening 430 onto fin 420 is substantially increased when compared to landing a similar opening on, for example, Fin 410. In general, various manufacturing techniques require a specific portion of space between groups of fins because of the tolerance associated with landing such an opening. In this embodiment, two portions of block mask material (460 and 465) are created. In some embodiments and scenarios such a layer of block mask facilitates controlling of the formation of opening 430.

In one embodiment, a layer of block mask material is deposited and then patterned, using selective etching to form the two portions of block mask material 460 and 465. Because the two portions of block mask material 460 and 465 are separated by a space (denoted by bracket 425) a subsequent etching to remove hard-mask material results in the formation of opening 430 through the layer of hard-mask material, creating two portions of hard-mask material (i.e., hard-mask material 450 and 455). Note that the shape of space 425 that separates block mask material 460 and 465 controls the formation of opening 430 through the layer of hard-mask material. In this embodiment, the two portions of block mask material 460 and 465 are then removed, using selective etching, after the creation of hard-mask material 450 and 455. In general, the removal of one or more fins is a technique used to create groups of fins for the manufacture of semiconductor devices. Each group of fins can then be configured to perform specific purposes. In another embodiment, a layer of block mask is deposited over hard-mask material 450 and 455.

Figure 4A:
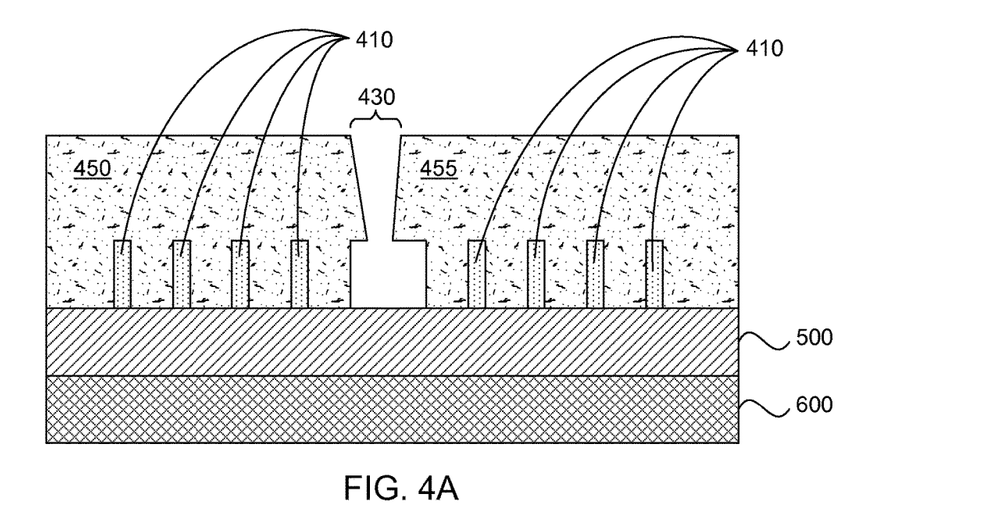
FIG. 4A illustrates a cross-sectional view depicting the removal of the central fin from the fins formed in FIG. 3A, in accordance with an embodiment of the present invention.

FIG. 4A illustrates a cross-sectional view depicting the removal of the central fin (fin 420) from the fins formed in FIG. 3A, in accordance with an embodiment of the present invention. In general, hard-mask material 450 and 455 protect fins 410 from removal by the etching process used to remove fin 420. In one embodiment, a wet etching process is used to remove fin 420.

Figure 4B:
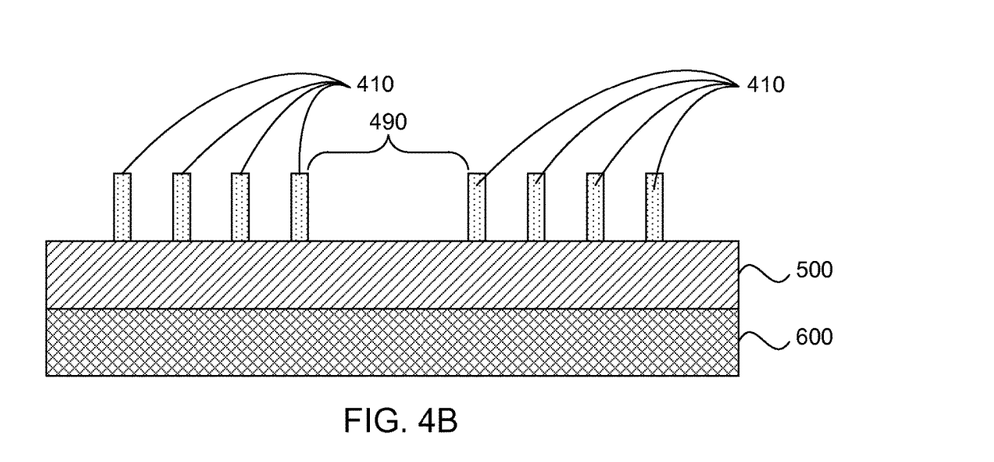
FIG. 4B illustrates a cross-sectional view depicting the removal of the layer of hard-mask material from the fins formed in FIG. 4A, in accordance with an embodiment of the present invention.

FIG. 4B illustrates a cross-sectional view depicting the removal of the layer of hard-mask material 450 and 455 from fins 410 formed in FIG. 4A, in accordance with an embodiment of the present invention. In another embodiment, removal of the layer of hard-mask material 450 and 455 includes removal of a layer of block mask, if such a layer was deposited over hard-mask material 450 and 455. In general, the removal of fin 420 results in formation of a distance (shown in FIG. 4B using bracket 490) that is void of any fins. This distance is greater than a width of fin 420 and this distance separates the two fins 410 that were nearest to (i.e., were nested adjacent to) fin 420.

FIG. 5 illustrates a cross-sectional view depicting two variations of semiconductor devices formed using the processes shown FIGS. 1A-4B, in accordance with two embodiments of the present invention. FIG. 5 shows a comparison of 40 nm footprint fins herein called semiconductor devices (510) and 30 nm footprint fins herein called semiconductor devices (520), each of which are produced using the processes described by FIGS. 1A-4B. Note that the processes described herein and shown using FIGS. 1A-4B are able to be used for a range of footprints. In FIG. 5, semiconductor devices 510 were created to have a 40 nm footprint while semiconductor devices 520 were created to have a 30 nm footprint. Semiconductor devices 510 and semiconductor devices 520 are created from two portions of silicon of equivalent size. In both semiconductor devices 510 and semiconductor devices 520 active fins are shown as black bars while inactive fins are shown as white bars. As can be seen in FIG. 5, the utilization of the processes described herein provides for a significantly higher active fin concentration in semiconductor devices 520 when compared with semiconductor devices 510. As can be seen in FIG. 5, there are eight active fins in the 30 nm footprint semiconductor devices compared to only five active fins in the 40 nm footprint semiconductor devices. This results in an increase in the area efficiency of approximately sixty percent. In other words, per unit of silicon used, the effective usage of the silicon for fin (e.g., transistor) formation is increased by sixty percent when comparing the 40 nm footprint semiconductor devices and 30 nm footprint semiconductor devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Having described embodiments for a semiconductor structure and a method of forming that semiconductor structure, it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the method as described above is used in the fabrication of integrated circuit chips. The fabrication steps described above may be included on a semiconductor substrate consisting of many devices and one or more wiring levels to form an integrated circuit chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method of forming a semiconductor structure, the method comprising:
    forming a plurality of fins from a layer of semiconductor material, wherein at least one first fin of the plurality of fins is at least fifty percent wider than each second fin of a group of second fins included in the plurality of fins, and wherein the width of the at least one first fin is substantially similar to the combined widths of a pair of first spacers and a first mandrel located between the pair of first spacers used to pattern the at least one first fin; and forming a space between at least two second fins of the group of second fins by selectively removing the at least one first fin such that only the group of second fins remain in the plurality of fins, wherein the space is (i) void of fins and (ii) is greater than the width of the at least one first fin.

2. The method of claim 1, wherein forming a plurality of fins from a layer of semiconductor material further includes:
forming mandrels on a semiconductor substrate;
forming spacers on sidewalls of the mandrels; and
forming the plurality of fins by patterning according to at least some of the mandrels and the spacers, wherein the mandrels and the spacers overlay portions of the semiconductor substrate.

3. The method of claim 2, the method further including:
using a portion of first block mask material to cover the pair of first spacers and the first mandrel located between the pair of first spacers, wherein the pair of first spacers and the first mandrel cover a first region of the semiconductor material from which the at least one first fin will be formed; and forming a pattern for the group of second fins by removing at least one second mandrel between the plurality of second spacers, wherein the at least one second mandrel is in a region that is not covered by the portion of first block mask material, and wherein the plurality of second spacers cover segments of a second region of the semiconductor material from which the group of second fins will be formed.

4. The method of claim 3, the method further including:
removing the portion of first block mask material after the at least one second mandrel has been removed.

5. The method of claim 3, the method further including:
performing reactive ion etching (RIE) (i) to form the group of second fins by patterning in a second region of the semiconductor material using the plurality of second spacers, and (ii) to form the at least one first fin in a first region of the semiconductor material that is covered by the pair of first spacers and the mandrel located between the pair of first spacers.

6. The method of claim 1, wherein forming a plurality of fins from a layer of semiconductor material further includes:
depositing a first layer of hard-mask material to cover the plurality of fins.

7. The method of claim 6, the method further including:
creating at least one portion of second block mask material over the first layer of hard-mask material; and
applying reactive ion etching (RIE) to form an opening through the layer of first hard-mask material that is not covered by the at least one portion of second block mask material to expose a portion of the at least one first fin while the group of second fins remain covered by the first layer of hard-mask material.

8. The method of claim 7, the method further including:
etching to remove the at least one first fin.

9. The method of claim 7, the method further including:
removing the at least one portion of second block mask material.

10. The method of claim 9, the method further including:
etching to remove the first layer of hard-mask material.

11. A method of forming a semiconductor structure, the method comprising:
selectively removing at least one first fin from a plurality of fins such that only a group of second fins remain in the plurality of fins, wherein the at least one first fin of the plurality of fins is at least fifty percent wider than each fin of the group of second fins, wherein the width of the at least one first fin is substantially similar to the combined widths of a pair of first spacers and a first mandrel located between the pair of first spacers used to pattern the at least one first fin and wherein selectively removing the at least one fin comprises:
applying one or both of a first portion of block mask material and a layer of hard-mask material that cover the at least one first fin and the group of second fins;
forming an opening through one or both of the first portion of block mask material and the layer of hard-mask material such that a portion of at least one first fin is exposed while the group of second fins remain covered by one or both of the first portion of block mask material and the layer of hard-mask material; and
forming a space between at least two second fins of the group of second fins by selectively etching to remove the at least one first fin such that the space is (i) void of fins and (ii) is greater than the width of the at least one first fin.

12. The method of claim 11, the method further including:
forming the plurality of fins from a layer of semiconductor material, wherein the at least one first fin of the plurality of fins is at least fifty percent wider than each second fin of the group of second fins included in the plurality of fins.

13. The method of claim 11, wherein forming a plurality of fins from a layer of semiconductor material further includes:
forming mandrels on a semiconductor substrate;
forming spacers on sidewalls of the mandrels; and
forming the plurality of fins by patterning according to at least some of the mandrels and the spacers, wherein the mandrels and the spacers overlay portions of the semiconductor substrate.

14. The method of claim 13, the method further including:
using a second portion of block mask material to cover the pair of first spacers and a first mandrel located between the pair of first spacers, wherein the pair of first spacers and the first mandrel cover one or more mandrels in a first region of the semiconductor material where the at least one first fin will be formed;
forming a pattern for the group of second fins by removing at least one second mandrel between a plurality of second spacers, wherein the at least one second mandrel is in a region that is not covered by the portion of first block mask material, and wherein the plurality of second spacers cover segments of a second region of the semiconductor material from which the group of second fins will be formed, and
removing the second portion of block mask material after the at least one second mandrel has been removed.

15. The method of claim 14, the method further including:
performing reactive ion etching (RIE) to form the group of second fins in a region that is not covered by the second portion of block mask material and to form the at least one first fin in the region that is covered by the portion of block mask material
performing reactive ion etching (RIE) (i) to form the group of second fins by patterning the second region of the semiconductor material using the plurality of second spacers, and (ii) to form the at least one first fin in a first region of the semiconductor material that is covered by the pair of first spacers and the mandrel located between the pair of first spacers.

16. The method of claim 11, wherein forming a plurality of fins from a layer of semiconductor material further includes:
   depositing the layer of hard-mask material to cover the plurality of fins.

17. The method of claim 11, the method further including:
   forming an opening through the first portion of block mask material by etching to remove at least a portion of the first portion of block mask material, wherein a shape of the opening through the first portion of block mask material controls formation of the opening through the layer of hard-mask material.

18. The method of claim 11, the method further including:
   etching to remove at least a portion of the layer of hard-mask material after the at least one first fin is removed.

\* \* \* \* \*